(12) United States Patent
Clark et al.

(10) Patent No.: US 8,835,289 B2
(45) Date of Patent: Sep. 16, 2014

(54) WAFER BACKSIDE DEFECTIVITY CLEAN-UP UTILIZING SELECTIVE REMOVAL OF SUBSTRATE MATERIAL

(71) Applicant: International Business Machines Corporation, Armonk, NY (US)

(72) Inventors: Jennifer C. Clark, Poughkeepsie, NY (US); Emily R. Kinser, Poughkeepsie, NY (US); Ian D. Melville, Highland, NY (US); Candace A. Sullivan, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/916,098

(22) Filed: Jun. 12, 2013

(65) Prior Publication Data

US 2013/0273743 A1 Oct. 17, 2013

Related U.S. Application Data

(62) Division of application No. 13/187,917, filed on Jul. 21, 2011, now Pat. No. 8,486,814.

(51) Int. Cl.
*H01L 21/311* (2006.01)
*H01L 23/544* (2006.01)
*H01L 21/306* (2006.01)
*H01L 21/02* (2006.01)

(52) U.S. Cl.
CPC ........... *H01L 21/311* (2013.01); *H01L 23/544* (2013.01); *H01L 21/30604* (2013.01); *H01L 2223/54453* (2013.01); *H01L 21/0209* (2013.01); *H01L 2223/54433* (2013.01); *H01L 21/30608* (2013.01); *Y10S 438/977* (2013.01)

USPC ........... 438/526; 438/528; 438/705; 438/977

(58) Field of Classification Search
USPC ............... 438/526, 528, 705, 977, FOR. 158; 257/E21.569
See application file for complete search history.

(56) References Cited

U.S. PATENT DOCUMENTS

| | | | |
|---|---|---|---|
| 5,013,681 A | 5/1991 | Godbey et al. | |
| 5,289,031 A | 2/1994 | Watanabe et al. | |
| 5,296,385 A * | 3/1994 | Moslehi et al. | ............... 438/514 |
| 6,171,513 B1 | 1/2001 | Davis et al. | |
| 6,220,771 B1 | 4/2001 | Tung et al. | |
| 6,344,414 B1 | 2/2002 | Davis et al. | |
| 7,402,477 B2 * | 7/2008 | Sadaka et al. | ................. 438/199 |

(Continued)

OTHER PUBLICATIONS

Chang, K., et al. "An Accurate Determination of P+ Silicon Layer Thickness for Microstructures" Journal of the Chinese Institute of Electrical Engineering, vol. 5, No. 2. 1998. pp. 107-111.

(Continued)

*Primary Examiner* — George Fourson, III
(74) *Attorney, Agent, or Firm* — Tutunjian & Bitetto, P.C.; Catherine Ivers

(57) ABSTRACT

A wafer and a fabrication method include a base structure including a substrate for fabricating semiconductor devices. The base structure includes a front side where the semiconductor devices are formed and a back side opposite the front side. An integrated layer is formed in the back side of the base structure including impurities configured to alter etch selectivity relative to the base structure such that the integrated layer is selectively removable from the base structure to remove defects incurred during fabrication of the semiconductor devices.

12 Claims, 3 Drawing Sheets

(56) References Cited

U.S. PATENT DOCUMENTS

| | | |
|---|---|---|
| 7,405,139 B2 | 7/2008 | Daubenspeck et al. |
| 7,427,811 B2 | 9/2008 | Derderian et al. |
| 7,615,386 B2 * | 11/2009 | Anderson .................. 438/6 |
| 7,705,466 B2 | 4/2010 | Leedy |
| 7,781,343 B2 | 8/2010 | Letz et al. |
| 7,811,904 B2 | 10/2010 | Feng et al. |
| 7,855,149 B2 | 12/2010 | Kim et al. |
| 8,269,327 B2 * | 9/2012 | Leedy ..................... 257/678 |
| 8,350,295 B1 * | 1/2013 | Saunier et al. ............ 257/194 |
| 8,367,521 B2 * | 2/2013 | Daval et al. .............. 438/459 |
| 2005/0224921 A1 * | 10/2005 | Gupta et al. ............. 257/621 |
| 2007/0063777 A1 * | 3/2007 | Capanu et al. ........... 331/107 A |
| 2009/0194768 A1 * | 8/2009 | Leedy ..................... 257/48 |

OTHER PUBLICATIONS

Ding, S., et al. "A Beam Operated MEMS Variable Optical Attenuator" Proceedings of SPIE, Vol. 6984. Mar. 2008. pp. 1-4.

* cited by examiner

WAFER BACKSIDE DEFECTIVITY CLEAN-UP UTILIZING SELECTIVE REMOVAL OF SUBSTRATE MATERIAL

RELATED APPLICATION INFORMATION

This application is a Divisional application of allowed, commonly assigned, co-pending U.S. patent application Ser. No. 13/187,917 filed on Jul. 21, 2011, incorporated herein by reference in its entirety.

BACKGROUND

1. Technical Field

The present invention relates to semiconductor wafers, and more particularly to wafers and methods for reducing backside wafer defects.

2. Description of the Related Art

During standard semiconductor wafer processing, a backside of a silicon wafer incurs defects that cannot be eliminated with traditional surface cleaning processes. Defects can include both additions to the backside as well as micro-gouging in the exposed substrate surface. While such defects may not pose a concern to whole-wafer fabrication processing or to the performance of devices and other front-side features, once the wafers are converted to chips and assembled in standard bond and assembly packaging processing, significant issues with chip cracking have been observed due to backside defects which serve as stress concentrators or initiation locations for microcracks.

These defects may be difficult or impossible to easily detect reliably in-line. Even if detected during wafer fabrication, limitations with traditional wet chemistries designed to clean or etch silicon pose challenges to remedying backside defects with processes and methods that are typically compatible with back-end-of-line (BEOL) semiconductor processing. Such processes usually blunt cracks without removing them and possibly induce additional defects as artifacts of the backside clean processing.

While some silicon etchants known in the art may successfully remove some micro-cracks, different types of defects such as pitting may still occur on the wafer backside as a result of the backside etch processing. Such defects have been observed even on wafer backsides which have been terminated with a chemical mechanical polish (CMP) which gives a planar surface with a mirrored finish. Further, the use of a backside wet etch increases variability in outgoing wafer thickness, which increases variability in downstream processing and creates challenges with automated wafer handling. Higher variability leads to the need for increased inspections and rework, thus resulting in longer wafer fabrication time and increased cost per wafer. Additionally, the inscribed wafer identifier (ID) can also be damaged or obscured by a non-selective silicon wet thinning operation, which poses a significant challenge for automated wafer handling.

Backside defects can be a customer satisfaction issue. Degraded strength of the chip due to backside defects has been shown to correlate with module build yield and potential in-field reliability issues. In addition to aesthetic issues which confound in-line inspection data and lead to issues with supplier rejection, the defects induced by the wet silicon etch may cause pitting in the wafer backside surface, which poses a longer term reliability concern with chip cracking, which also may negatively impact customer satisfaction.

SUMMARY

A wafer and a fabrication method include a base structure consisting of a substrate for fabricating semiconductor devices. The base structure includes a front side where the semiconductor devices are formed and a back side opposite the front side. An integrated layer is formed in the back side of the base structure including impurities configured to alter etch selectivity relative to the base structure such that the integrated layer is selectively removable from the base structure to remove defects incurred during fabrication of the semiconductor devices.

Another wafer in accordance with the present principles includes a base structure including a substrate for fabricating semiconductor devices. The base structure including a front side where the semiconductor devices are formed and a back side opposite the front side. An endpoint layer is formed on the back side of the wafer and has an etch selectivity relative to the base structure. A sacrificial layer is disposed on the endpoint layer.

A method for reducing back side wafer defects includes providing a semiconductor wafer substrate; implanting impurities into a back side of the wafer to form an integrated doped layer being selectively removable from a base structure of the wafer; processing a front side of the wafer to fabricate semiconductor devices; and selectively removing the integrated doped layer to remove processing defects incurred on the backside of the wafer substrate.

Another method for reducing back side wafer defects includes providing a semiconductor wafer substrate; forming an endpoint layer on a back side of the wafer that is selectively removable from a base structure of the wafer; providing a sacrificial layer on the endpoint layer; processing a front side of the wafer to fabricate semiconductor devices; removing the sacrificial layer from the endpoint layer; and selectively removing the endpoint layer from the base structure to remove processing defects incurred on the backside of the wafer substrate.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
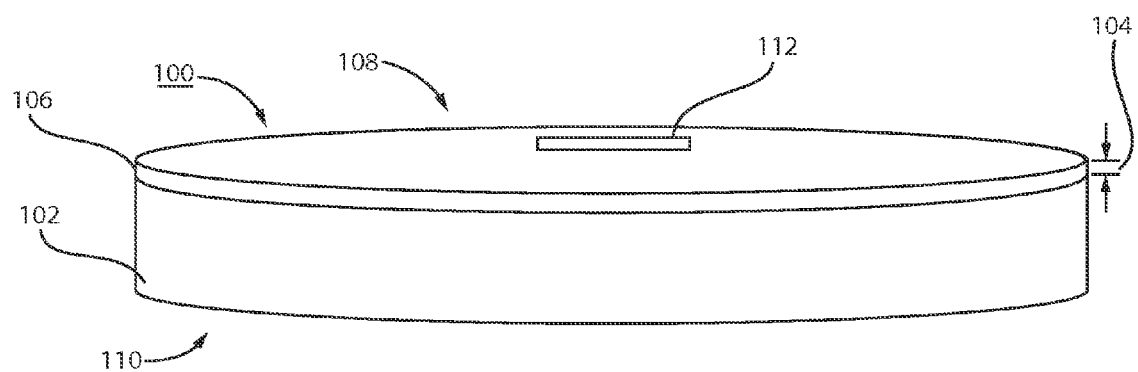
FIG. 1 is a perspective view of a wafer assembly with an integrated back side layer in accordance with the present principles.

In accordance with the present principles, a wafer substrate is provided with a selectively removable protection layer. In one embodiment, a silicon wafer includes a backside doped silicon layer, which can be removed at a conclusion of wafer processing. The doped silicon layer may be removed by utilizing a selective wet etch chemistry that will endpoint on the base substrate material after removal of the doped layer. By adding a selective substrate layer, accumulated backside damage on the base substrate can be avoided and additional defects typically associated with removal of the protective layer may be eliminated. The endpoint capability of a selective substrate also enables improved process control and integration, since any concerns with handling and contamination are mitigated by utilizing a backside protective layer that has the same base material as the base wafer substrate.

In other embodiments, the selective substrate layer may also be formed using an embedded oxide layer, or other embedded material layer which creates an interface to enable an endpoint process to be implemented to improve manufacturability and process repeatability. Such a layer would be embedded between two substrate layers (e.g., silicon), which would enable seamless handling during fabrication and minimize risk of tool contamination.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a wafer assembly 100 is shown in accordance with one illustrative embodiment. The wafer assembly 100 includes a base structure or base substrate 102. The base structure 102 may include any semiconductor material or base substrate material. Examples of the base structure material may include bulk silicon, semiconductor-on-insulator (SOI), silicon germanium, germanium, gallium arsenide, ceramic material, polymer materials or the like. In one particularly useful embodiment, the base structure 102 includes silicon. This embodiment will be described in greater detail to provide an illustrative description of the present principles.

The base structure 102 may include a thickness 104 on a backside 108 of the base structure 102 that is created during the substrate manufacturing process. When manufacturing the wafer substrates according to processes known in the art, such as the Czochralski process, the wafer thickness may be provided by slicing a silicon boule or ingot with additional thickness to account for a sacrificial layer 106 to be removed and thus leaving the final substrate thickness after removal of the sacrificial layer 106 at the same nominal substrate thickness as wafers without the sacrificial layer 106. Additionally, a thickness 104 can be provided by allocating the thickness within normal tolerances for wafer fabrication (e.g., backside etch budgeted thickness).

Thickness 104 has its etching properties altered by one or more processing steps, e.g., doping, oxidation, etc. In a particularly useful embodiment, thickness 104 is doped to form a sacrificial integrated doped layer 106, which forms a selective interface between the sacrificial integrated doped layer 106 and the base substrate 102. Thickness 104 may be doped to include the introduction of impurities, such as B, P, As, etc. or any other element or compound. The impurities may be introduced by ion bombardment, plasma treatment or other processes that introduce the impurities with a concentration and depth to define the thickness 104, thereby altering the etch properties of thickness 104 and forming a selective interface between sacrificial layer 106 and the base substrate 102. Thus, the etch properties of the sacrificial layer 106 become altered such that the sacrificial layer 106 can be removed selectively with respect to the base structure 102. The defined interface between sacrificial layer 106 and the base substrate 102 enables a selective etch endpoint at the interface, which results in a highly uniform surface after the removal of sacrificial layer 106.

A further consideration for the selection of the impurity type and implantation process is the desire not to contaminate devices or structure fabrication on a front side 110 of the base structure 102. Proper protection of the front side 110, using methods known in the art, may enable the use of many combinations of processing steps and impurity types. The thickness 104 of sacrificial layer 106 may include a thickness of between about 10 to 100 microns, with a preferred range being between about 30 to 50 microns; however, other thicknesses are contemplated depending on the processing and handling parameters for the wafer assembly 100 during fabrication.

After fabrication steps on the front side 110 of the wafer assembly 100 are complete, any damage incurred on the back side 108 may be removed, e.g., by etching away the sacrificial layer 106 and terminating the etch process by utilizing the interface between sacrificial layer 106 and base substrate 102 as an endpoint. Additional intermediate thinning operations such as a backside grind or reactive ion etch can be completed to reduce the initial thickness 104 of sacrificial layer 106 prior to the final removal of the remaining thickness of sacrificial layer 106. It is preferable that the sacrificial layer 106 possess many or all of the same mechanical properties as the original base substrate structure 102. In this way, equipment for chucking, handling, and processing semiconductor substrates does not have to be modified to account for the sacrificial layer 106 during fabrication processing.

A wafer identifier (ID) 112 can be created prior to the development of the sacrificial layer 106. Depending on the thickness of the sacrificial layer 106, the wafer ID 112 can be re-created on the back side 108 surface of the sacrificial layer 106 after its formation. The wafer ID may also be created on the base structure 102 prior to forming the sacrificial layer 106 as either an embossed or raised ID. In this way, wafer ID 112 should be visible even after the formation of the sacrificial layer 106.

Figure 2:
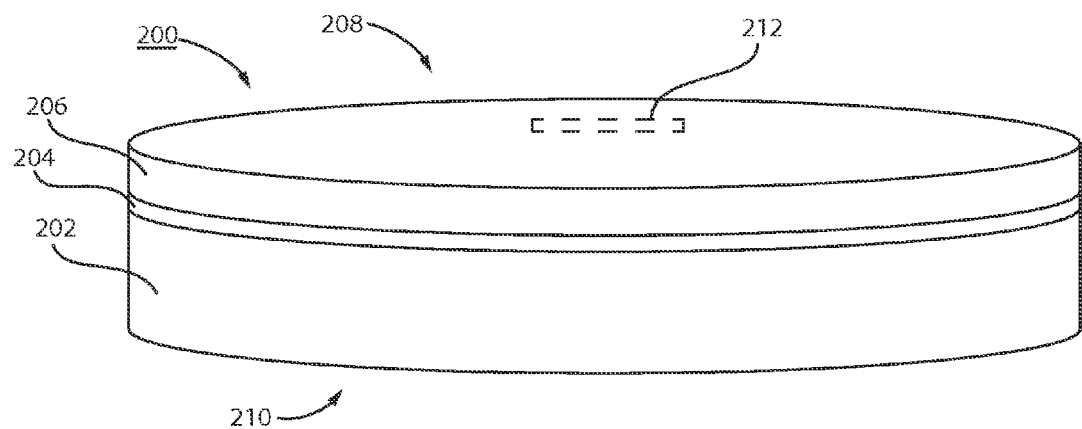
FIG. 2 is a perspective view of a wafer assembly with a back side endpoint layer and sacrificial layer in accordance with another embodiment.

Referring to FIG. 2, another wafer assembly 200 is shown in accordance with another illustrative embodiment. The wafer assembly 200 includes a base structure or base substrate 202. The base structure 202 may include any semiconductor material or base substrate material. Examples of the base structure material may include bulk silicon, semiconductor-on-insulator (SOI), silicon germanium, germanium, gallium arsenide, ceramic material, polymer materials or the like.

The base structure 202 may include an embedded endpoint layer or etch stop layer 204 on a backside 208 of the base structure 202. The embedded endpoint layer 204 may have a thickness of between about 1 to 10 microns although other thicknesses may be employed. A sacrificial substrate layer 206 may be formed on the endpoint layer 204. The sacrificial layer 206 may be formed on the endpoint layer 204 by processes similar to those employed in fabricating SOI substrates known in the art. For example, the endpoint layer 204 may include a buried oxide (BOX) layer on the back side 208 of the wafer structure and is coated with a silicon-on-insulator (SOI) layer for the sacrificial layer 206. Both layer 204 and layer 206 will be removed after final wafer processing.

In one embodiment, the sacrificial layer 206 may be grown by employing a chemical vapor deposition, molecular beam epitaxy or other deposition process. In an alternate embodiment, a wafer bonding technique may be employed.

The sacrificial substrate layer 206 may include a p-doped or n-doped silicon material, a polysilicon material, a bonded thinned silicon wafer, a silicon germanium material, or any other substrate material known in the art with mechanical properties comparable to layer 202. It is preferable that the sacrificial layer 206 possess many or all of the same mechanical properties as the original base structure 202. In this way, equipment for chucking, handling, and processing semiconductor substrates does not have to be modified to account for the sacrificial layer 206 during fabrication processing.

In particularly useful embodiments, endpoint layer 204 may include an oxide layer, e.g., silicon oxide, a nitride layer, e.g., silicon nitride, a polymer layer, epitaxial silicon or may include a doped silicon (n or p) region, e.g., similar to the embodiment described with reference to FIG. 1. Sacrificial layer 206 may include any material but with the same concerns regarding contamination or removal processes that would otherwise be detrimental to the components and structures formed on a front side 210 of the base structure 202. Proper protection of the front side 210 may enable the use of many combinations of processing steps and material types for the sacrificial layer 206 and/or the endpoint layer 204. The sacrificial layer 206 and the endpoint layer 204 may include a combined thickness of about 10 to 100 microns, with a preferred range of about 30 to 50 microns; however, other thicknesses are contemplated depending on the processing and handling parameters for the wafer assembly 200 during fabrication.

After fabrication steps for the front side 210 of the wafer assembly 200 are complete, any damage incurred on the back side 208 may be removed by removing the sacrificial layer 206 by using endpoint layer 204 as a means of selectively terminating the etch process, leaving a highly uniform surface, and then etching away the endpoint layer 204 down to leave only the base structure 202. Intermediate nonselective thinning operations such as a backside grind or reactive ion etch can be completed to reduce the initial thickness of sacrificial layer 206 prior to the final removal of the remaining thickness of sacrificial substrate layer 206.

A wafer ID 212 may be inscribed on the sacrificial layer 212. The wafer ID can also be created on the back side 208 prior to the formation of the endpoint layer 204.

Figure 3:
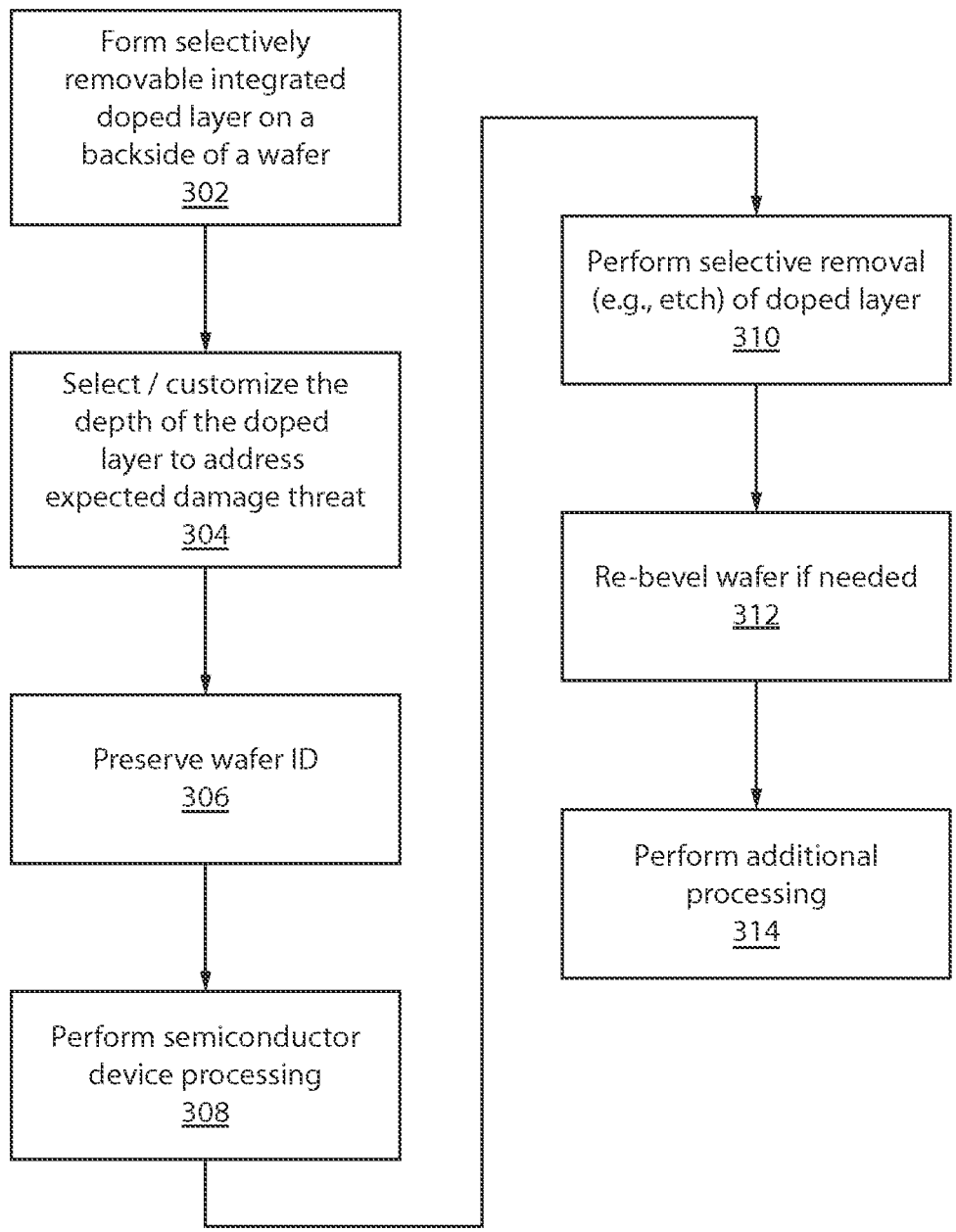
FIG. 3 is a block/flow diagram for fabricating the wafer assembly of FIG. 1 in accordance with one illustrative embodiment.

Referring to FIG. 3, a block/flow diagram is shown for an illustrative method for forming the wafer assembly 100 in accordance with the present principles. In block 302, during a wafer substrate manufacturing process, a selectively removable doped or damaged region is formed on the backside of the wafer. The doped region may have a thickness of about 10 to 100 microns, with a preferred range of 30 to 50 microns. In block 302, the doped region includes impurities implanted in the back side of the wafer by an implantation process (e.g., ion implantation, plasma exposure, etc.) or diffusion process (e.g., deposit a dopant/impurity layer and anneal to drive-in dopants/impurities). Other techniques may also be employed to change the etch properties of the doped region to make the doped region selectively removable with respect to the base structure/wafer substrate. In addition, if contamination is properly addressed, the back side impurity material not restricted.

In block 304, a selectively removable layer thickness is selected/customized to address depth of damage caused by wafer processing in a particular instance. The thickness of the doped region is adjusted accordingly.

In block 306, the wafer ID is ensured to be intact, and if not the wafer ID is re-inscribed on the doped layer using methods known in the art. The wafer ID can be created prior to the development of the selectively doped layer. Depending on the thickness of the selectively doped layer, the wafer ID can be re-created on the exposed surface of the doped layer after its formation. The wafer ID may also be created on the base structure prior to forming the selective doped layer as either an embossed or raised ID. In this way, wafer ID should be visible even after the formation of the selective doped layer.

In block 308, standard front, middle and back end of line wafer processing is performed on a front side of the wafer substrate. In block 310, after final back end of line metal termination processing, but prior to standard photosensitive polyimide (PSPI) passivation processing, a selective removal of the doped layer is performed, e.g., by an etch using a selective chemistry to remove the doped region. The removal process is endpointed on the interface between the doped region and the base structure. By adding the selective doped layer, accumulated back side damage can be removed while eliminating the incursion of additional defects caused by the removal process.

In block 312, if needed, due to decreased wafer thickness resulting from the removal of the sacrificial doped layer, the bevel along the wafer backside may be reformed to create a uniform, rounded edge according to tool handling specifications, using mechanical grinding or other beveling methods known in the art. The re-beveling operation may be performed on the backside where the selective doped layer was removed or on the entire substrate thickness to mitigate wafer handling issues for downstream processing.

In block 314, further processing continues as is known in the art. This may include dicing the wafer to provide chips, forming passivation layers, forming interconnects, etc.

Figure 4:
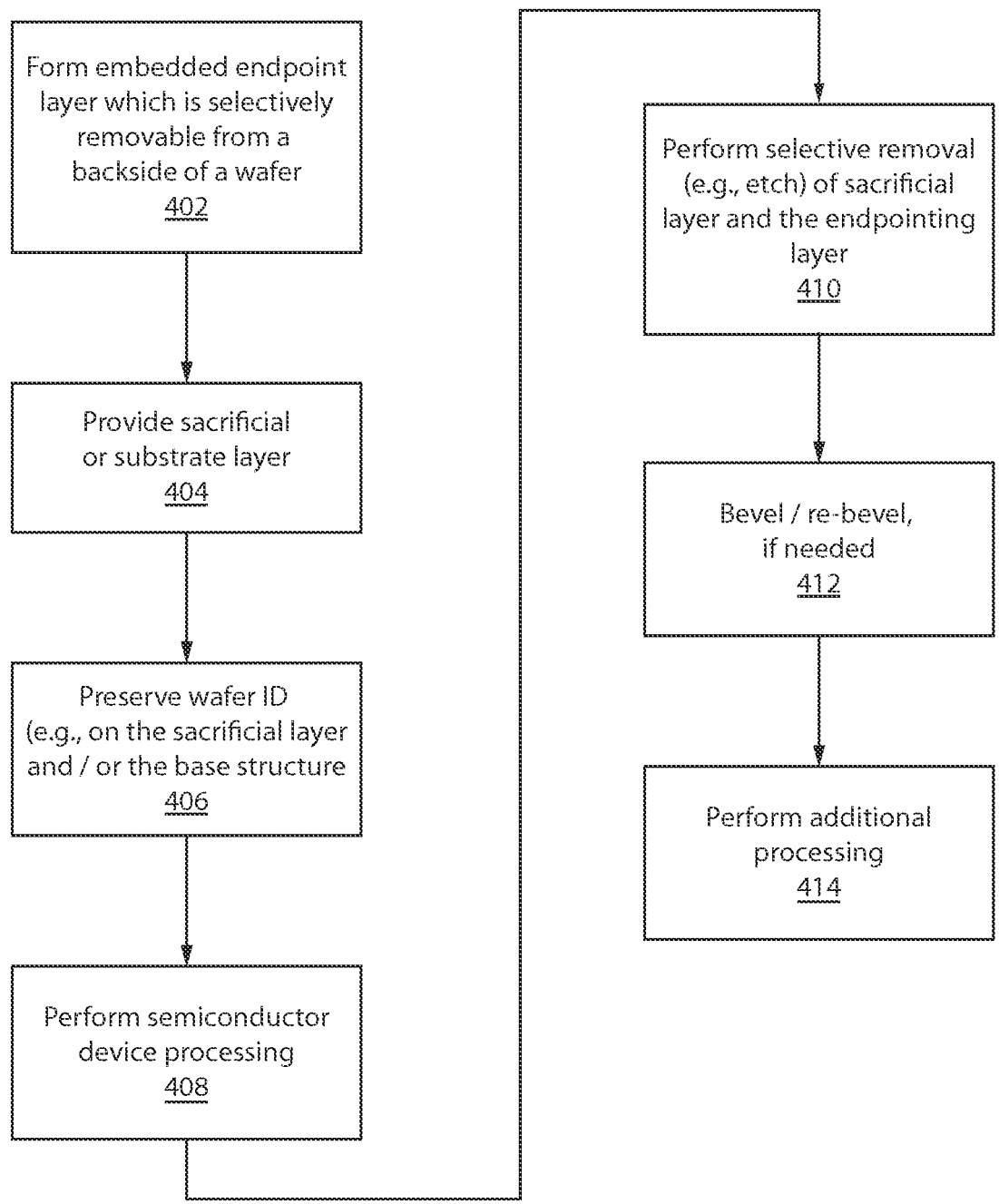
FIG. 4 is a block/flow diagram for fabricating the wafer assembly of FIG. 2 in accordance with another illustrative embodiment.

Referring to FIG. 4, a block/flow diagram is shown for an illustrative method for forming the wafer assembly 200 in accordance with the present principles. In block 402, during a wafer substrate manufacturing process, an embedded endpoint layer is formed on a back side of a base wafer substrate structure. The embedded layer may be formed from an oxide, nitride, a P-doped Si or other material which would create an interface to enable an endpointed process to improve manufacturability and process repeatability. In block 404, an additional sacrificial or substrate layer may be added to the embedded layer on the backside of the base wafer substrate. This would include the embedded layer being disposed between two substrate layers (e.g., the base structure and the sacrificial substrate layer). The present principles enable seamless handling during fabrication and minimize any risk of tool contamination. The embedded layer and the sacrificial substrate may have a combined thickness of about 10 to 100 microns, with a preferred range of 30 to 50 microns. The layer thicknesses may be selected/customized to address depth of damage caused by wafer processing in a particular instance.

In block 406, the wafer ID is re-inscribed on the sacrificial substrate layer. The wafer ID can be inscribed on the sacrificial substrate layer at any time during the processing. The wafer ID can be re-created on the exposed surface of the sacrificial substrate layer after its formation. The wafer ID may also be placed on the substrate layer prior to installing the sacrificial substrate layer. The wafer ID may also be inscribed on the base structure.

In block 408, standard front, middle and back end of line wafer processing is performed on a front side of the wafer substrate. In block 410, after final back end of line metal termination processing, but prior to standard photosensitive polyimide (PSPI) passivation processing, a selective etch or grinding process using a selective chemistry is performed to remove the sacrificial substrate layer ending on the interface between the endpoint region and the base structure. This process may be performed in steps as well. For example, the sacrificial substrate layer may be removed in a first process and the endpoint layer could be removed in a second process. If the endpoint layer includes oxide, nitride, or other non-Si material, remnants of endpoint layer are removed using a backside clean chemistry that will only remove that material and not impact the base structure material of the wafer. By employing the sacrificial substrate layer, accumulated back side damage can be removed or avoided while eliminating any defects induced during the removal process.

In block 412, if needed, due to decreased wafer thickness resulting from the removal of the sacrificial substrate layer and embedded endpoint layer, the bevel along the wafer backside may be reformed to create a uniform, rounded edge according to tool handling specifications, using mechanical grinding or other beveling methods known in the art. The re-beveling operation may be performed on the backside where the selectively removable layer was removed or on the entire substrate thickness to mitigate wafer handling issues for downstream processing.

In block 414, further processing continues as is known in the art. This may include dicing the wafer to provide chips, forming passivation layers, forming interconnects, etc.

For the methods shown in FIGS. 3 and 4, it should be understood that any material that can survive semiconductor processing and can then be removed utilizing a selective etch may be employed as the sacrificial backside layer. For example, a wet etch can be integrated at any point in the process flow in which the substrate remains whole (e.g., prior to separating the wafer to create individual chips). For example, if desired, wet thinning could be completed after laser grooving but prior to saw dicing the wafer to possibly eliminate the need for saw dicing or additional backside thinning operations. By extending the target depth of the laser grooving operation into the sacrificial region of the wafer substrate but not entirely through the backside of the wafer substrate in a pattern which isolates each chip, each chip would then be separated after the removal of the sacrificial layer, thus eliminating the need for additional saw dicing or thinning.

Further, the present embodiments provide a back side protection system, which is integrated into a wafer substrate. A selective back side etch (e.g., a wet etch, such as an HF, HCl, HNA, KOH, TMAH, or similar chemistries known in the art) or other removal process (e.g., reactive ion etch, backside grind, etc.) of a protective layer integrated into the base structure eliminates defects induced from the thinning process, to which there is no current solution and enables an endpoint for back side etching, which is a significant process control improvement, e.g., fewer inspections, reworks, and consistent wafer thickness, thereby reducing variability in the fabrication process and enabling improved chip and module process yield and reliability. Wet etching can be integrated at any point in the process flow in which the substrate remains whole.

Having described preferred embodiments of a wafer backside defectivity clean-up utilizing a selective etch substrate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing back side wafer defects, comprising:
    forming an endpoint layer on a back side of a semiconductor wafer substrate that is selectively removable from a base structure of the wafer;
    providing a sacrificial layer on the endpoint layer;
    processing a front side of the wafer;
    removing the sacrificial layer from the endpoint layer; and
    selectively removing the endpoint layer from the base structure to remove processing defects incurred on the backside of the wafer substrate.

2. The method as recited in claim 1, wherein selectively removing the endpoint layer includes wet etching the endpoint layer to expose the base structure.

3. The method as recited in claim 1, wherein providing a sacrificial layer includes utilizing a semiconductor-on-insulator (SOI) process to provide the sacrificial layer.

4. The method as recited in claim 1, wherein providing a sacrificial layer includes growing the sacrificial layer on the endpoint layer.

5. The method as recited in claim 1, further comprising embossing a wafer identifier on the base structure that is visible after etching the endpoint layer.

6. The method as recited in claim 5, further comprising placing a wafer identifier on the sacrificial layer.

7. A method for reducing back side wafer defects, comprising:
    providing a semiconductor wafer substrate;
    forming an endpoint layer on a back side of the wafer that is selectively removable from a base structure of the wafer;
    providing a sacrificial layer on the endpoint layer;
    processing a front side of the wafer to fabricate semiconductor devices;
    removing the sacrificial layer from the endpoint layer; and
    selectively removing the endpoint layer from the base structure to remove processing defects incurred on the backside of the wafer substrate.

8. The method as recited in claim 7, wherein selectively removing the endpoint layer includes wet etching the endpoint layer to expose the base structure.

9. The method as recited in claim 7, wherein providing a sacrificial layer includes utilizing a semiconductor-on-insulator (SOI) process to provide the sacrificial layer.

10. The method as recited in claim 7, wherein providing a sacrificial layer includes growing the sacrificial layer on the endpoint layer.

11. The method as recited in claim 7, further comprising embossing a wafer identifier on the base structure that is visible after etching the endpoint layer.

12. The method as recited in claim 11, further comprising placing a wafer identifier on the sacrificial layer.

* * * * *